US010483258B2

(12) United States Patent
Shrivastava et al.

(10) Patent No.: US 10,483,258 B2
(45) Date of Patent: Nov. 19, 2019

(54) SEMICONDUCTOR DEVICES AND METHODS TO ENHANCE ELECTROSTATIC DISCHARGE (ESD) ROBUSTNESS, LATCH-UP, AND HOT CARRIER IMMUNITY

(71) Applicant: Indian Institute of Science, Bangalore (IN)

(72) Inventors: Mayank Shrivastava, Bangalore (IN); Milova Paul, Bangalore (IN); Harald Gossner, Riemerling (DE)

(73) Assignee: INDIAN INSTITUTE OF SCIENCE, Karnataka, Bangalore (IN)

( * ) Notice: Subject to any disclaimer, the term of this patent is extended or adjusted under 35 U.S.C. 154(b) by 0 days.

(21) Appl. No.: 15/899,117

(22) Filed: Feb. 19, 2018

(65) Prior Publication Data
US 2018/0247929 A1    Aug. 30, 2018

(30) Foreign Application Priority Data
Feb. 25, 2017    (IN) .............................. 201741006745

(51) Int. Cl.
*H01L 27/02*    (2006.01)
*H01L 27/12*    (2006.01)
(Continued)

(52) U.S. Cl.
CPC .. *H01L 27/0266* (2013.01); *H01L 21/823814* (2013.01); *H01L 27/0262* (2013.01);
(Continued)

(58) Field of Classification Search
CPC . H01L 27/026; H01L 27/088; H01L 27/1203; H01L 29/7843; H01L 29/7851;
(Continued)

(56) References Cited

U.S. PATENT DOCUMENTS 6,020,240 A * 2/2000 Wu .................... H01L 21/82344
257/E21.622
6,063,672 A * 5/2000 Miller ............... H01L 21/82342
257/E21.62
(Continued)

FOREIGN PATENT DOCUMENTS

JP    1-259560    * 10/1989

OTHER PUBLICATIONS

English Abstract of JP-1-259560 to Yoshimatsu Masahiro.*

*Primary Examiner* — Hrayr A Sayadian
(74) *Attorney, Agent, or Firm* — Michael Best & Friedrich LLP (57) ABSTRACT

The present disclosure relates to non-planar ESD protection devices. The present disclosure provides a device structure and method of fabricating the structure that is essentially immune to latch-up and possess high ESD robustness and reliability. In an aspect, the present disclosure provides a mixed silicidation and selective epitaxy (epi) FinFET processes for latch-up immunity together with ESD robustness, thereby allowing achievement of ESD efficient parasitic structures together with latch-up immune and reliable functional devices. The present disclosure provides a dual silicidation scheme where ESD protection element(s) have fins that are partially silicided, and functional devices have fins that are fully silicided. The present disclosure also provides a hybrid contact and junction profile scheme where ESD protection element(s) have fins that are partially silicided with or without deep junctions depending on their application, and functional devices have fins that are fully silicided with the silicide edge crossing the junction. On the other hand, a dual Epi scheme is implemented such that ESD protection elements have fins with Epi contact, and func-
(Continued)

tional devices have fins that are fully silicided without Epi (raised S/D) contact.

8 Claims, 8 Drawing Sheets

(51) Int. Cl.
- *H01L 29/78* (2006.01)
- *H01L 29/74* (2006.01)
- *H01L 21/8238* (2006.01)
- *H01L 27/092* (2006.01)
- *H01L 27/088* (2006.01)
- *H01L 21/8234* (2006.01)
- *H01L 27/06* (2006.01)

(52) U.S. Cl.
CPC ...... *H01L 27/0921* (2013.01); *H01L 27/0924* (2013.01); *H01L 27/1203* (2013.01); *H01L 29/7436* (2013.01); *H01L 29/7843* (2013.01); *H01L 29/7851* (2013.01); *H01L 21/823418* (2013.01); *H01L 27/0623* (2013.01); *H01L 27/088* (2013.01)

(58) Field of Classification Search
CPC ......... H01L 29/7436; H01L 21/823418; H01L 27/0262
USPC ....................................................... 257/355
See application file for complete search history.

(56) References Cited

U.S. PATENT DOCUMENTS

| | | |
|---|---|---|
| 6,909,149 B2 | 6/2005 | Russ et al. |
| 7,135,745 B1 | 11/2006 | Horch et al. |
| 7,166,876 B2 | 1/2007 | Huang |
| 7,560,784 B2 | 7/2009 | Cheng et al. |
| 7,638,370 B2 | 12/2009 | Gossner et al. |
| 7,888,775 B2 | 2/2011 | Russ et al. |
| 7,964,893 B2 | 6/2011 | Lee |
| 8,927,397 B2 | 1/2015 | Chang et al. |
| 8,928,083 B2 | 1/2015 | Chang et al. |
| 8,941,161 B2 | 1/2015 | Basker et al. |
| 8,963,201 B2 | 2/2015 | Shrivastava et al. |
| 9,006,054 B2 | 4/2015 | Cheng et al. |
| 9,177,951 B2 | 11/2015 | Singh et al. |
| 9,214,540 B2 | 12/2015 | Tsai et al. |
| 9,236,374 B2 | 1/2016 | Campi, Jr. et al. |
| 9,240,471 B2 | 1/2016 | Di Sarro et al. |
| 9,318,622 B1 | 4/2016 | Logan et al. |
| 9,368,629 B2 | 6/2016 | Tsai et al. |
| 9,391,060 B2 | 7/2016 | Hellings et al. |
| 2004/0207021 A1 | 10/2004 | Russ et al. |
| 2005/0212051 A1 | 9/2005 | Jozwiak et al. |
| 2006/0063334 A1 | 3/2006 | Donze et al. |
| 2007/0040221 A1 | 2/2007 | Gossner et al. |
| 2007/0262386 A1 | 11/2007 | Gossner et al. |
| 2007/0267700 A1* | 11/2007 | Russ ................... H01L 27/0255 257/355 |
| 2009/0206367 A1 | 8/2009 | Gauthier, Jr. et al. |
| 2009/0242993 A1* | 10/2009 | Hayashi ............. H01L 27/0266 257/360 |
| 2010/0187656 A1 | 7/2010 | Ke et al. |
| 2010/0207161 A1 | 8/2010 | Shrivastava et al. |
| 2012/0049282 A1 | 3/2012 | Chen et al. |
| 2013/0168732 A1 | 7/2013 | Lin et al. |
| 2013/0168771 A1 | 7/2013 | Wu et al. |
| 2013/0175578 A1 | 7/2013 | Lee et al. |
| 2013/0264640 A1* | 10/2013 | Salman ............. H01L 29/66659 257/343 |
| 2013/0292745 A1 | 11/2013 | Liu et al. |
| 2014/0097465 A1 | 4/2014 | Shrivastava et al. |
| 2014/0131765 A1 | 5/2014 | Tsai et al. |
| 2014/0183641 A1 | 7/2014 | Fan et al. |
| 2014/0191319 A1 | 7/2014 | Cheng et al. |
| 2014/0217502 A1 | 8/2014 | Chang et al. |
| 2014/0252476 A1 | 9/2014 | Chang et al. |
| 2015/0014809 A1 | 1/2015 | Wang et al. |
| 2015/0091090 A1 | 4/2015 | Okuno et al. |
| 2015/0137255 A1 | 5/2015 | Wen et al. |
| 2015/0145592 A1 | 5/2015 | Li et al. |
| 2015/0311342 A1 | 10/2015 | Lin et al. |
| 2016/0020203 A1 | 1/2016 | Zhang et al. |
| 2016/0064371 A1 | 3/2016 | Lee et al. |

* cited by examiner

SEMICONDUCTOR DEVICES AND METHODS TO ENHANCE ELECTROSTATIC DISCHARGE (ESD) ROBUSTNESS, LATCH-UP, AND HOT CARRIER IMMUNITY

TECHNICAL FIELD

The present disclosure relates to the field of electrostatic discharge (ESD) protection devices. In particular, the present disclosure pertains to a mixed silicidation and selective epitaxy (EPI) fin field effect transistor (FinFET) processes that enables latch-up immunity together with ESD robustness.

BACKGROUND

Background description includes information that may be useful in understanding the present invention. It is not an admission that any of the information provided herein is prior art or relevant to the presently claimed invention, or that any publication specifically or implicitly referenced is prior art.

There are many prior-art documents that provide different ways of designing non-planar ESD diodes. For example, US Patent documents U.S. Pat. No. 8,928,083B2. US2016/0020203A1. U.S. Pat. No. 7,560,784B2, US2014/0191319A1, US2006/0063334A1, U.S. Pat. No. 7,964,893B2, US2014/0183641A1, U.S. Pat. No. 9,006,054B2, US2014/0252476A1, U.S. Pat. No. 8,941,161B2, U.S. Pat. No. 9,177,951B2. U.S. Pat. No. 8,927,397B2, US2014/0217502A1, U.S. Pat. No. 9,368,629B, US2014/0131765A1, U.S. Pat. No. 9,391,060B2, US2015/0014809A1, U.S. Pat. No. 9,318,622B1, US2013/0292745A1. US2015/0091090A1, and U.S. Pat. No. 7,888,775B2 provide prior art ways of implementing BJT and SCR-like devices in FinFET technologies provide various designs of diode FinFET (non-planar ESD diodes), however, due to inefficacy of heat dissipation mechanisms and much higher packing density of active area (Fins/Nanowires), these designs exhibit an increased self-heating over the device active area, which leads to an early failure, hence lowered ESD robustness.

There are many prior-art documents that provide ways of implementing BJT and SCR-like devices in FinFET technologies such as but not limited to BJT/ggNMOS FinFET, SCR inventions in FinFET and bulk FinFET technology, SCR inventions with N and P trigger taps for injecting a trigger current (for tuning trigger/holding voltage) in planar SOI technology, and SCR inventions with N and P taps (terminals labeled with N-body and P-body) in a different scheme in order to control holding/trigger voltage in planar SOI technology. For example, US Patent documents US2010/0187656, US2015/0145592A1, US2007/0262386A1, US2007/0040221A1, US2015/0311342A1, US2012/0049282A1, US2013/0168732A1, US2013/0175578A1, US2013/0168771A1, U.S. Pat. No. 7,166,876B2, U.S. Pat. No. 9,214,540B2, US2016/0064371A1, US2015/0137255A1, US2004/0207021A1, U.S. Pat. No. 6,909,149B2, US2005/0212051 A1, US2009/0206367A1, U.S. Pat. No. 7,638,370B2, US2010/0207161A1, U.S. Pat. No. 9,240,471B2, U.S. Pat. Nos. 9,236,374B2, 7,135,745B, 8,963,201B2, and US2014/0097465A1 disclose prior art ways to implement BJT and SCR-like devices in FinFET technologies, however solutions provided in these prior-arts too suffer from high packing density and enhanced self-heating.

Although, the advent of non-planar technologies has paved new and efficient ways to replace their planar counterparts by offering beneficial technological solutions to scale conventional transistors, this has come with a price of lowered ESD robustness in these advanced technology nodes.

Encountered during operation, latch-up is characterized as a high current condition where the device is irreversibly latched into a single electrical state typically preventing the entire circuit from functioning properly and resulting in device damage, if not complete destruction. The latch-up condition is generally attributed to the presence and undesirable function of parasitic bipolar transistors inherently formed in the CMOS FET structure. Configuration of parasitic bipolar transistors is such that a closed loop feedback path typically has a gain that is greater than the one that exists. Thus, when random operational conditions such as electrical transients are encountered, regenerating feedback occurs with a resultant latch-up of the device's electrical state.

CMOS latch-up is a commonly recognized problem. Correspondingly, a large variety of methods of reducing parasitic loop gain have been proposed. These include, most notably, the provision of parasitic-current blocking or shorting guard-ring structures interposed between the complementary PMOS and NMOS FET transistors of the CMOS device, utilizing a deep peak or retrograde doping profile well region, irradiation of the CMOS device with high energy particles such as neutrons and protons, and provision of low resistivity buried layers in the CMOS structure. However, these methods are variously disadvantageous due to substantially increased device structure and fabrication process complexity, low degrees of reproducibility, excessive degradation of device's operating characteristics including substantially increased leakage currents, and, in particular, failure to reduce the parasitic feedback loop gain to less than one.

In principle, ESD robustness and latch-up immunity due to parasitic SCRs goes hand-in-hand. ESD is a random event that leads to massive flow of current (in amperes) between bodies having different electrostatic potential for sub-500 ns duration. Latch-up is a type of short circuit that can occur in an integrated circuit (IC). More specifically it is the inadvertent creation of a low-impedance path between power supply rails of a MOSFET circuit, triggering a parasitic structure that disrupts proper functioning of the part, possibly even leading to its destruction due to extremely high current. Typically, a technology offering efficient parasitic SCR device would have least immunity towards latch-up and vice-versa.

Further, it is also observed that a technology offering efficient parasitic SCR device for better ESD protection would have least immunity towards latch-up and vice-versa. Thus, from technology point of view, one would like to have efficient ESD SCR and BJT devices, and at the same time, one would like to ensure highest latch-up immunity of parasitic SCRs under the functional devices.

There is therefore a need in the art for a solution that ensures efficient ESD protection SCR and BJT devices and also possesses highest latch-up immunity of parasitic SCRs under the functional devices which can be across ESD protection devices in non-planar technologies, thereby enhancing product reliability and life expectancy. There is also a need to provide a solution that can selectively enhance parasitic (SCR/Bipolar) action in intended parasitic, ESD devices, whereas the same can suppress the parasitic (SCR/Bipolar) action in functional devices.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description used in the appended claims.

OBJECTS OF THE INVENTION

It is an object of the present disclosure to provide efficient ESD SCR and BJT devices.

It is an object of the present disclosure to provide latch-up immune functional devices.

It is an object of the present disclosure to provide a technological solution that achieves ESD efficient protection devices and ensures highest latch-up immunity of parasitic SCRs under the functional devices which can be across ESD protection devices in non-planar technologies.

It is an object of the present disclosure to provide enhanced product reliability and life expectancy.

It is an object of the present disclosure to provide a solution that can selectively enhance parasitic (SCR/Bipolar) action in intended parasitic/ESD devices, or can suppress the same in functional devices.

SUMMARY

The present disclosure relates to the field of electrostatic discharge (ESD) protection devices. In particular, the present disclosure pertains to a mixed silicidation and selective epitaxy (EPI) fin field effect transistor (FinFET) processes that enables latch-up immunity together with ESD robustness. Also, the present disclosure pertains to a hybrid contact and junction profiles for FinFET technology that provides improved ESD robustness for ESD protection devices while achieving reliable I/O and core devices.

In an aspect, the present disclosure relates to a method comprising the steps of: partially siliciding one or more fins of at least one electrostatic discharge (ESD) protection device that forms part of the semiconductor device; and fully siliciding one or more fins of at least one functional device that forms part of the semiconductor device.

In an aspect, the ESD protection device (SCR and Diode) can undergo deeper junction profiles with a combination of partial contact silicidation. Also, the proposed ESD protection device (BJT and FinFET) can undergo only partial contact silicidation without deeper junctions.

In an aspect, the at least one I/O or core devices can be incorporated with junction profiles that are encapsulated within the contact silicide, to improve the reliability characteristics.

In an aspect, the at least one ESD protection device and the at least one functional device can be configured on a substrate. In another aspect, the one or more fins of the at least one ESD protection device undergo selective epitaxial growth in their N+/P+ diffusion regions to enable the fins to have raised N+/P+ contacts before undergoing partial silicidation.

In an aspect, the at least one ESD protection device can be any or a combination of a BJT ESD protection device and a SCR ESD protection device. In another aspect, the at least one ESD protection device can include a first SCR ESD protection device and a second BJT ESD protection device, wherein the at least one functional device can be sandwiched between the first SCR ESD protection device and a second BJT ESD protection device.

The present disclosure further relates to a method comprising the steps of: performing selective epitaxial growth on one or more fins of at least one electrostatic discharge (ESD) protection device that forms part of the semiconductor device followed by silicidation; and fully siliciding one or more fins of at least one functional device that forms part of the semiconductor device. In an aspect, the one or more fins of the at least one functional device does not undergo epitaxial growth.

In an exemplary aspect, the selective epitaxial growth can be performed by any or a combination of growing epitaxial silicon using vapor-phase epitaxy (VPE), molecular-beam epitaxy (MBE), liquid-phase epitaxy (LPE), and solid-phase epitaxy.

In another aspect, the semiconductor device can be adapted to selectively enhance ESD protection in the at least one ESD protection device, and suppress parasitic action in the at least one functional device.

The present disclosure further relates to a semiconductor device comprising at least one ESD protection device and at least one functional device, wherein the at least one ESD protection device is partially silicided, and can have deeper junction profiles, and wherein the at least one functional device that is fully silicided, with junction profiles encapsulated within the contact silicide.

The present disclosure further relates to a semiconductor device comprising at least one ESD protection device and at least one functional device, wherein the at least one ESD protection device undergoes selective epitaxial growth before silicidation, and wherein the at least one functional device is fully silicided without the epitaxial growth. In an aspect, the device can include one or more guard rings. In another aspect, the device can include at least one fin made of nanowire or an array of nanowires on top of each other. The fin can also be made of any or a combination of Si, SiGe, and Ge, materials belonging to III-V or III-Nitride groups, transition metal dichalcogenides or other 2-Dimensional semiconductors. In another aspect, 3D structure of the proposed semiconductor device can be repeated in X and Y directions so as to create devices with larger electrical widths. In yet another aspect, substrate of the device can pertain to any or a combination of a semiconductor, an insulator, and a stack of the semiconductor and insulator. In another aspect, the present disclosure relates to an integrated circuit made of semiconductor device as described above.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION

The following is a detailed description of embodiments of the disclosure depicted in the accompanying drawings. The embodiments are in such detail as to clearly communicate the disclosure. However, the amount of detail offered is not intended to limit the anticipated variations of embodiments, on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

Various terms as used herein are shown below. To the extent a term used in a claim is not defined below, it should be given the broadest definition persons in the pertinent art have given that term as reflected in printed publications and issued patents at the time of filing.

In principle, ESD robustness and latch-up immunity due to parasitic SCRs go hand-in-hand, wherein ESD is a random event that leads to massive flow of current (in amperes) between bodies having different electrostatic potential for sub-500 ns duration. The latch-up is a type of short circuit that can occur in an integrated circuit (IC). More specifically, latch-up relates to inadvertent creation of a low-impedance path between power supply rails of a MOSFET circuit, which triggers a parasitic structure that disrupts proper functioning of a part of the circuit, possibly even leading to its destruction due to extremely high current. Typically, a technology offering efficient parasitic SCR device for better ESD protection would have least immunity towards latch-up and vice-versa.

A general purpose of the present invention is therefore to provide a device structure and a method of fabricating the structure that is essentially immune to latch-up and also provides higher ESD robustness.

Accordingly, the present disclosure relates to non-planar ESD protection devices. In an aspect, the purpose above is accomplished in the present disclosure by providing mixed silicidation and hybrid junction profiles and selective epitaxy (epi) FinFET process for latch-up immunity together with ESD robustness and improved reliability. The present disclosure allows achieving ESD efficient parasitic structures together with latch-up immune functional devices.

The present disclosure provides a process for achieving ESD efficient parasitic structures together with latch-up immune function/functional devices, wherein the process ensures efficient ESD protection devices and highest latch-up immunity of parasitic SCRs under the functional devices which can be across ESD protection devices in non-planar technologies, thereby enhancing product reliability and life expectancy.

In an aspect, solution provided according to the present disclosure provides a technology option that can selectively enhance parasitic (SCR/Bipolar) action in intended parasitic/ESD devices, and at the same time, suppress the same in functional devices.

The present disclosure relates to the field of electrostatic discharge (ESD) protection devices. In particular, the present disclosure pertains to a mixed silicidation and selective epitaxy (EPI) fin field effect transistor (FinFET) processes that enables latch-up immunity together with ESD robustness and improved reliability.

In an aspect, the present disclosure relates to a method comprising the steps of: partially siliciding one or more fins of at least one electrostatic discharge (ESD) protection device that forms part of the semiconductor device; and fully siliciding one or more fins of at least one functional device that forms part of the semiconductor device.

In an aspect, the at least one ESD protection device and the at least one functional device can be configured on a substrate. In another aspect, the one or more fins of the at least one ESD protection device undergo selective epitaxial growth in their N+/P+ diffusion regions to enable the fins to have raised N+/P+ contacts before undergoing partial silicidation.

In an aspect, the at least one ESD protection device can be any or a combination of a BJT ESD protection device and a SCR ESD protection device. In another aspect, the at least one ESD protection device can include a first SCR ESD protection device and a second BJT ESD protection device, wherein the at least one functional device can be sandwiched between the first SCR ESD protection device and a second BJT ESD protection device.

The present disclosure further relates to a method comprising the steps of: performing selective epitaxial growth on one or more fins of at least one electrostatic discharge (ESD) protection device that forms part of the semiconductor device followed by silicidation; and fully siliciding one or more fins of at least one functional device that forms part of the semiconductor device. In an aspect, the one or more fins of the at least one functional device does not undergo epitaxial growth.

In an exemplary aspect, the selective epitaxial growth can be performed by any or a combination of growing epitaxial silicon using vapor-phase epitaxy (VPE), molecular-beam epitaxy (MBE), liquid-phase epitaxy (LPE), and solid-phase epitaxy.

In another aspect, the semiconductor device can be adapted to selectively enhance ESD protection in the at least one ESD protection device, and suppress parasitic action in the at least one functional device.

The present disclosure further relates to a semiconductor device comprising at least one ESD protection device and at least one functional device, wherein the at least one ESD protection device is partially silicided, and wherein the at least one functional device is fully silicided.

The present disclosure further relates to a semiconductor device comprising at least one ESD protection device and at least one functional device, wherein the at least one ESD protection device undergoes selective epitaxial growth before silicidation, and wherein the at least one functional device is fully silicided without the epitaxial growth. In an aspect, the device can include one or more guard rings. In another aspect, the device can include at least one fin made of nanowire or an array of nanowires on top of each other. The fin can also be made of any or a combination of Si, SiGe, and Ge, materials belonging to III-V or III-Nitride groups, transition metal dichalcogenides or other 2-Dimensional semiconductors. In another aspect, 3D structure of the proposed semiconductor device can be repeated in X and Y directions so as to create devices with larger electrical widths. In yet another aspect, substrate of the device can pertain to any or a combination of a semiconductor, an insulator, and a stack of the semiconductor and insulator. In another aspect, the present disclosure relates to an integrated circuit made of semiconductor device as described above.

In an aspect, the present disclosure provides a dual silicidation scheme where ESD protection element has fins that are partially silicided (also referred to ESD protection element is partially silicided), and functional device has fins that are fully silicided (also referred to as functional device is fully silicided). In an exemplary implementation, silicidation is an anneal (sintering) process that results in formation of metal-Si alloy (silicide) to act as a contact, e.g. Ti deposited on Si forms $TiSi_2$ as a result of silicidation. In another exemplary implementation, silicidation can be a well-known process that reduces source, drain, and gate resistances of submicron metal-oxide-semiconductor devices, wherein this process can be particularly useful for devices that have been built on very thin Si layers (1000 Å or less) on insulators because of large source and drain resistances associated with the thin Si layer. NiSi is a good candidate for salicidation process due to its low resistivity, low formation temperature, little silicon consumption, and large stable processing temperature window.

In an aspect, the present disclosure relates to the incorporation of partial silicidation and deeper junction implants for SCR or Diode ESD protection devices, and only partial silicidation for BJT or grounded gate FinFET (ggFinFET) ESD protection devices.

In another aspect, the present disclosure relates to the incorporation of junction profiles which are encapsulated within the contact silicide, for I/O and core functional devices, thereby improving the product reliability and life expectancy.

In another aspect, the present disclosure provides a dualepitaxy (epi) scheme where ESD protection element has fins with Epi contact, and functional device has fins that are fully silicided without Epi (raised S/D) contact. In an exemplary implementation, epitaxy can refer to deposition of a crystalline over layer on a crystalline substrate, wherein the over layer is called an epitaxial film or epitaxial layer. Epitaxial films may be grown from gaseous or liquid precursors. Because the substrate acts as a seed crystal, the deposited film may lock into one or more crystallographic orientations with respect to the substrate crystal. If the over layer either forms a random orientation with respect to the substrate or does not form an ordered over layer, it is termed as non-epitaxial growth. If an epitaxial film is deposited on a substrate of the same composition, the process is called homoepitaxy; otherwise it is called heteroepitaxy.

In another exemplary implementation, epitaxial silicon can be grown using vapor-phase epitaxy (VPE), which is a modification of chemical vapor deposition. Molecular-beam and liquid-phase epitaxy (MBE and LPE) may also be used mainly for compound semiconductors. Solid-phase epitaxy, is used primarily for crystal-damage healing.

Thus, an advantage of the present invention is that by providing a mixed silicidation and selective epitaxy (epi) FinFET process, an efficient ESD SCR and BJT device can be obtained, and at the same time such a process ensures highest latch-up immunity of parasitic SCRs under the functional devices.

In an embodiment, the mentioned FinFET process, leading to efficient ESD SCR and BJT devices according to the present disclosure, can selectively enhance parasitic (SCR/Bipolar) action in intended parasitic/ESD devices, and can suppress the same in functional devices.

Figure 1:
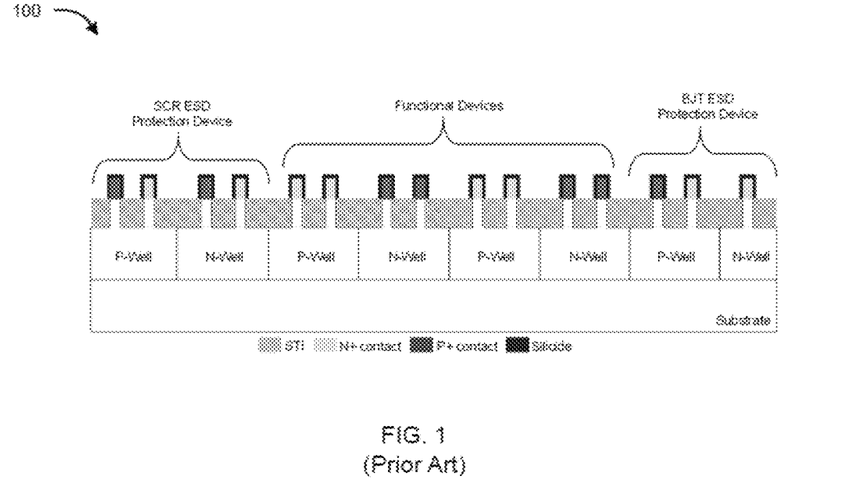
FIG. 1 illustrates a schematic view/side view of a conventional/existing bulk FinFET technology with full silicided fins.

FIG. 1 illustrates a schematic view/side view of a conventional bulk FinFET technology with full silicided fins. As shown in FIG. 1, the conventional bulk FinFET 100 has fins that are aligned along the plane of paper, wherein all the fins are fully silicided. Such conventional bulk FinFET, for example, can be obtained by using a method for manufacturing a full silicide metal gate bulk silicon multi-gate fin field effect transistor that includes the steps of: forming at least one fin on the semiconductor substrate; forming a gate stack structure on top and side surfaces of the fin; forming a source/drain extension area in the fin on both sides of the gate stack structure; forming a source/drain area on both sides of the source/drain extension area forming silicide on the source/drain area; forming a full silicide metal gate electrode; and forming contact and implementing metallization.

Figure 2:
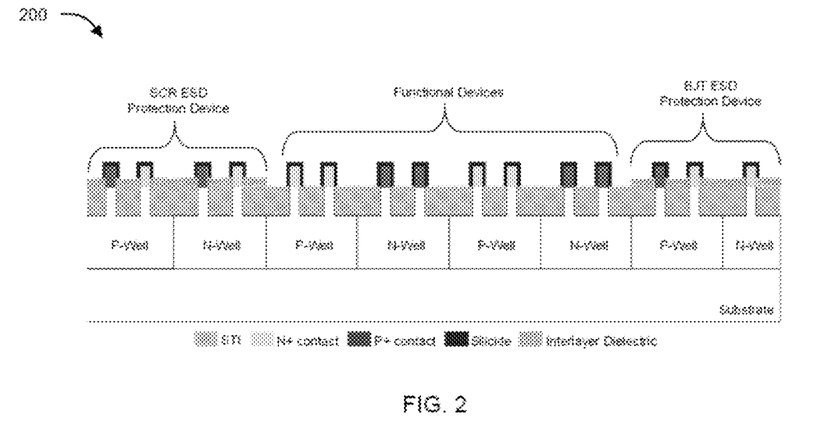
FIG. 2 illustrates a schematic view/side view of proposed dual silicidation process for FinFET technology in accordance with an embodiment of the present disclosure.

FIG. 2 illustrates a schematic view/side view of the proposed dual silicidation process for FinFET technology in accordance with an embodiment of the present disclosure. The proposed dual silicidation process for FinFET 200 enables selective silicidation of fins depending on their functionalities. In an embodiment, FIG. 2 shows the proposed scheme that discloses partial silicidation for ESD protection devices and full silicidation for function devices that require latch-up immunity. As can be seen, the FinFET 200 includes SCR ESD protection device (having a P-well and a N-well) and BJT ESD protection device (having a P-well and a N-well), both of which are partially silicided. FinFET 200 further includes one or more functional devices that are sandwiched between the SCR ESD protection device and the BJT ESD protection device, and includes one or more pairs of P-well and N-well, wherein the functional devices are fully silicided.

It would be appreciated that although the present example of FinFET has been described with respect to two ESD protection devices that sandwich between them the functional device(s), any other configuration of the present disclosure that is configured in a manner such that the functional devices(s) are fully silicided and ESD protection devices are partially silicided is well within the scope of the present invention. Configuration of each ESD protection device and/or functional device is also not limiting in any manner whatsoever. Any structure/configuration of the devices that include at least one ESD protection device and at least one functional device is therefore well within the scope of the present invention.

Figure 3:
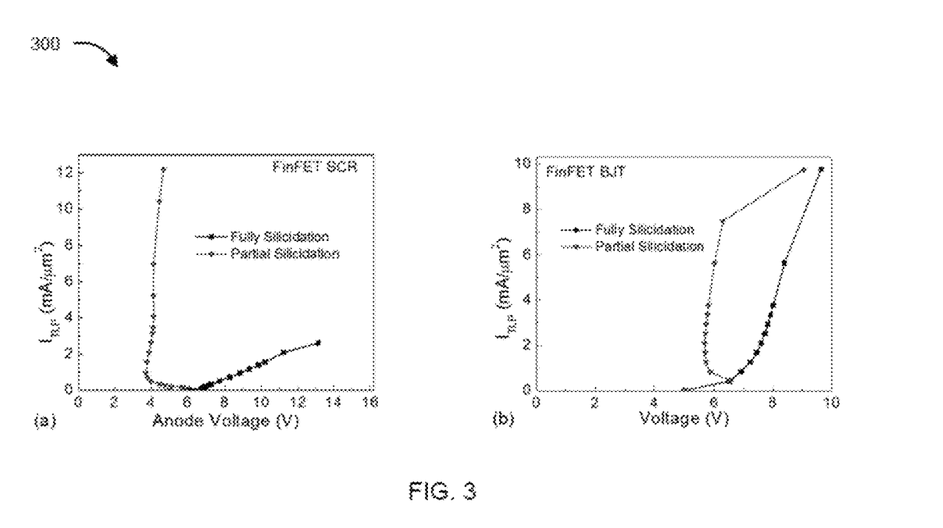
FIG. 3 shows a graph representing I-V characteristics of (a) FinFET SCR and (b) FinFET BJT with full and partial contact silicidation in accordance with an embodiment of the present disclosure.

FIG. 3 shows a graph representing current-voltage (I-V) characteristics of (a) FinFET SCR and (b) FinFET BJT, with full and partial contact silicidation in accordance with an embodiment of the present disclosure. I-V characteristics presented in the graph demonstrate least parasitic action when fin is fully silicided. The graph shows efficient SCR action when fins are partially silicided as compared to when fins were fully silicided.

Figure 4:
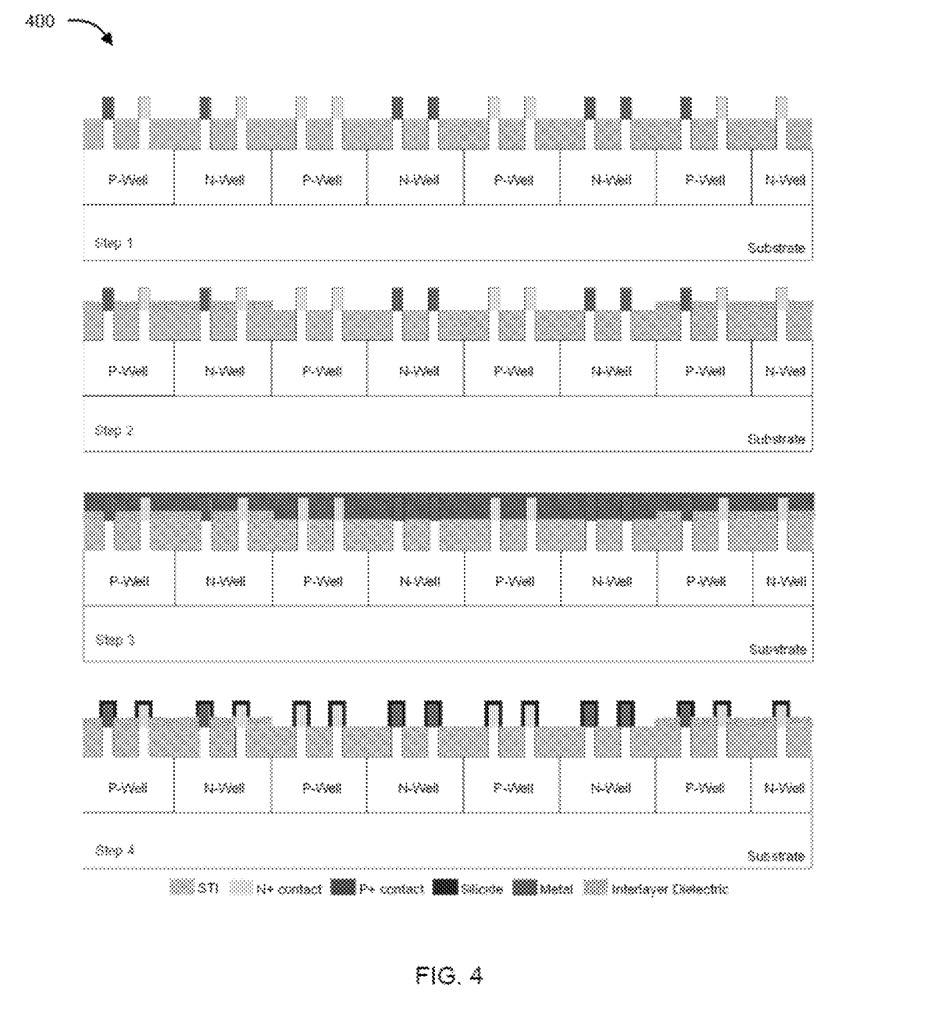
FIG. 4 shows a detailed process flow of the proposed FinFET scheme with full and partial silicidation in accordance with an embodiment of the present disclosure.

FIG. 4 shows a detailed process flow of the proposed FinFET scheme with full and partial silicidation in accordance with an embodiment of the present disclosure. As shown in FIG. 4 (Steps 1-4), a selective interlayer dielectric is deposited before silicidation, only over the ESD protection elements, to enable partial silicidation. As can be seen, at step 1, ESD protection elements and functional devices are configured over a substrate, followed by step 2, at which an interlayer dielectric can be deposited only over ESD protection elements before silicidation, post which, at step 3, silicidation can be performed by deposition of metal such that, at step 4, the ESD protection elements undergo only partial silicidation due to initial deposition of interlayer dielectric, and functional elements/devices undergo full silicidation.

Figure 5:
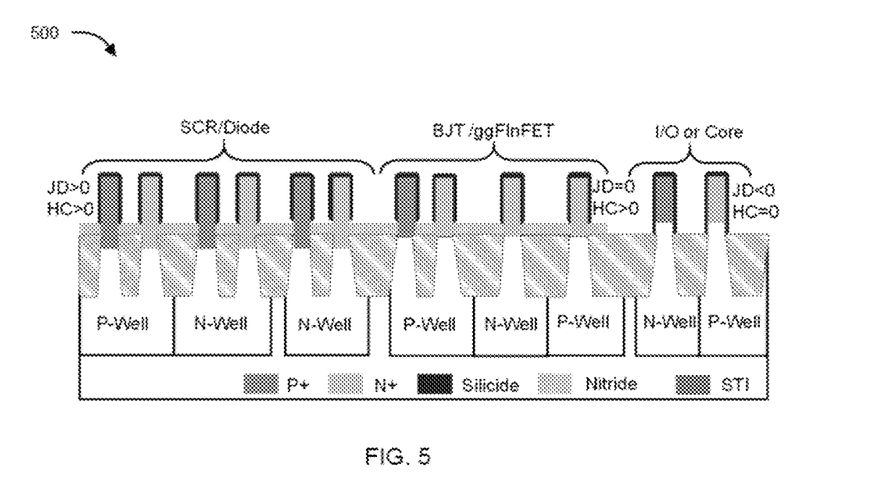
FIG. 5 illustrates a schematic view/side view of proposed hybrid contact and junction profile scheme for FinFET technology for improved ESD robustness and reliability in accordance with an embodiment of the present disclosure.

FIG. 5 illustrates a hybrid contact/silicide and junction profiles for FinFET technology, which utilizes unique contact/silicide height and junction depth for different types of devices on the chip, depending on their application, as an effective solution towards improved ESD robustness for ESD protection devices while achieving reliable I/O and core functional devices. This is achieved by using partial contact silicidation, where the silicide edge is above the junction with deeper junction profiles, for SCR and Diode ESD protection devices. Same without the deeper junction profiles can be employed for BJT and ggFinFET ESD protection devices. On the other hand, shallower junction profiles where silicide edge crosses the junction can be utilized for I/O and core functional devices. Here, contact silicidation crossing/encapsulating the junction suppresses the generation of hot carriers and mitigates lattice heating, which improves the product reliability and lifetime.

Figure 6:
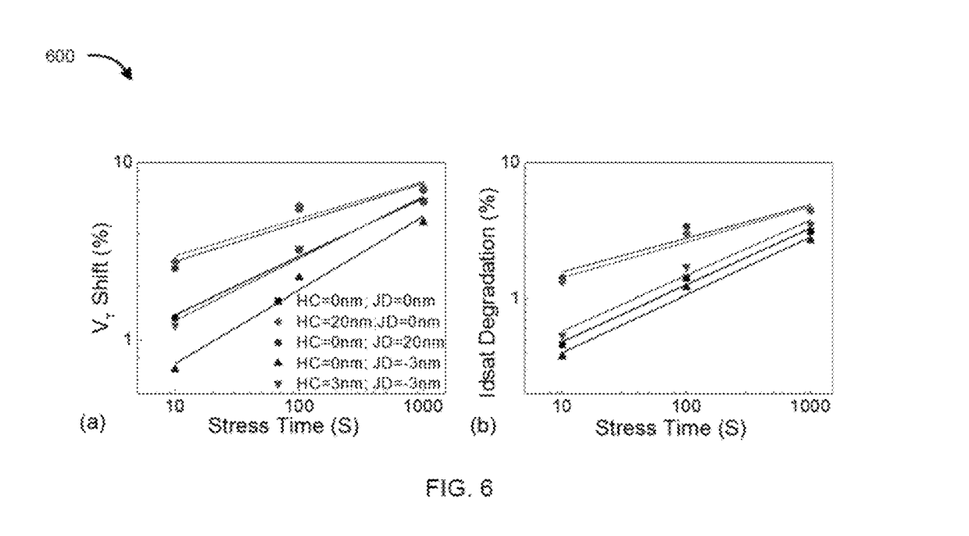
FIG. 6 shows a graph representing hot carrier induced (a) threshold voltage shift ($V_T$) and (b) ON current (Idsat) degradation with respect to stress time as a function of contact height and junction depth for a core functional FinFET device.

FIG. 6 shows a graph representing hot carrier induced (a) threshold voltage shift ($V_T$) and (b) ON current (Idsat) degradation with respect to stress time as a function of contact height and junction depth for a core functional FinFET device. In conditions of high electric field in a device, the conduction carriers (electrons and holes) gain sufficient energies (termed hot carriers) to break a lattice bond, leading to an increase in lattice temperature which further leads to device failure. For improved reliability of FinFET devices, the hot carrier induced degradation has to be suppressed, which is monitored by threshold voltage ($V_T$) shift and ON current (Idsat) degradation. As can be seen from FIG. 6, subdued hot carrier induced degradation is observed for the case where the contact/silicide edge encapsulates the junction profile i.e. by implementing shallower junction implants. This can be an effective methodology to improve the product reliability and life expectancy in FinFET technology.

Figure 7:
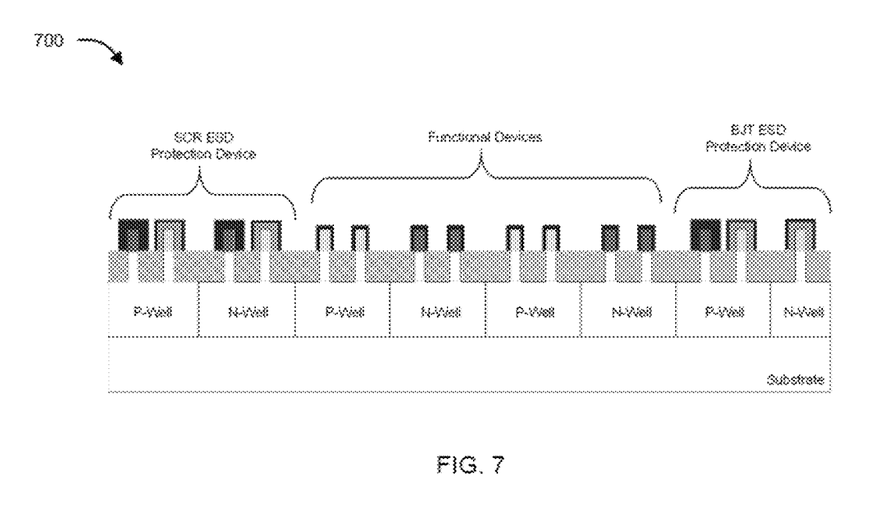
FIG. 7 shows a schematic view/side view of proposed dual Epi process for FinFET technology in accordance with an embodiment of the present disclosure.

FIG. 7 shows a schematic view/side view of the proposed dual Epi process for FinFET technology in accordance with an embodiment of the present disclosure. In an embodiment, such dual Epi process enables selective S/D epi growth for the fins depending on their functionalities. As can be seen, ESD protection devices (SCR and BJT) have raised S/D or epitaxial growth over S/D, which functional devices don't have. Therefore, a dual epitaxy (epi) scheme has been implemented where ESD protection element(s) have fins with Epi contact, and functional device(s) have fins that are fully silicided without Epi (raised S/D) contact. In an exemplary implementation, epitaxial silicon can be grown using vapor-phase epitaxy (VPE), which is a modification of chemical vapor deposition. Molecular-beam and liquid-phase epitaxy (MBE and LPE) may also be used mainly for compound semiconductors. Solid-phase epitaxy, is used primarily for crystal-damage healing.

Therefore, an advantage of the present invention is that by providing a mixed silicidation and selective epitaxy (epi) FinFET process, an efficient ESD SCR and BJT device can be obtained, and at the same time such a process ensures highest latch-up immunity of parasitic SCRs under the functional devices.

Figure 8:
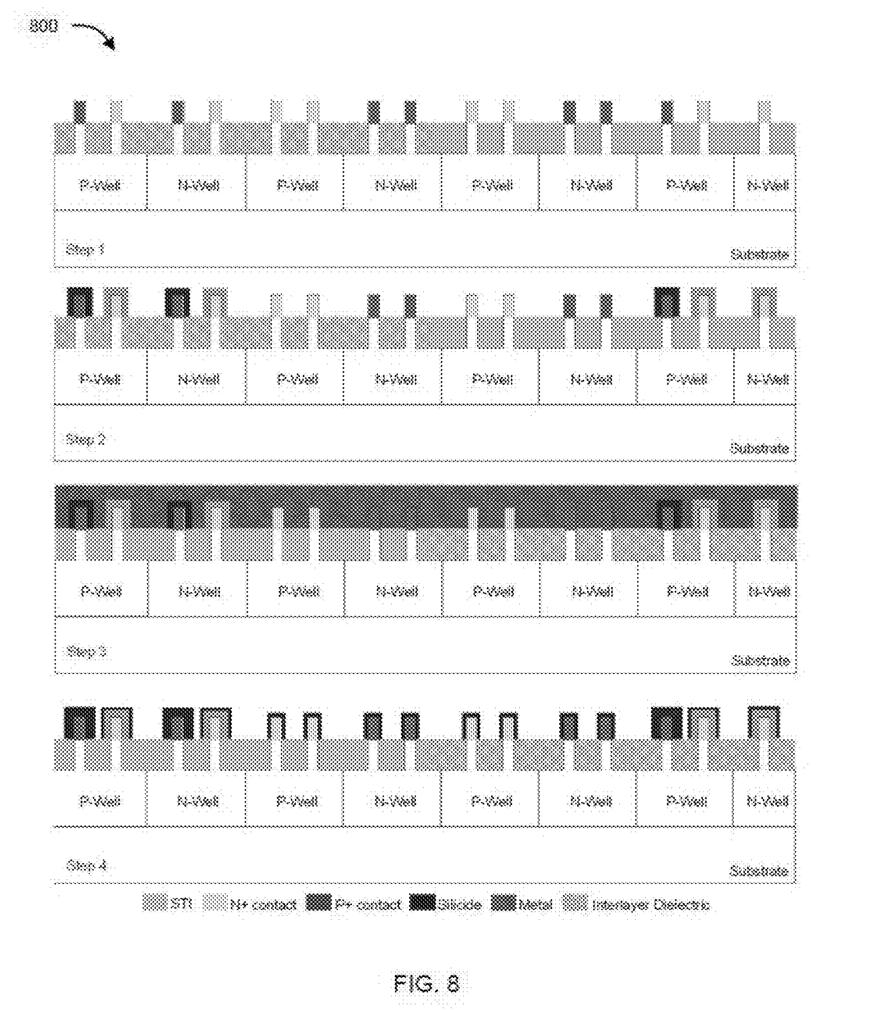
FIG. 8 shows detailed process flow of the proposed source/drain (S/D) epi scheme with selective epi depending on functionality in accordance with an embodiment of the present disclosure.

FIG. 8 shows detailed process flow of the proposed source/drain (S/D) epi scheme with selective epi depending on functionality in accordance with an embodiment of the present disclosure. As shown in FIG. 8 (Steps 1-4), the proposed source/drain (S/D) epi scheme provides selective epitaxial growth in the N+/P+ diffusion regions such that the fins over ESD protection structures have raised N+/P+ contact via, epi before silicidation, whereas functional devices that require latch-up immunity have S/D regions silicided without formation of raised S/D or epitaxial growth over S/D.

The present disclosure therefore provides a dual silicidation scheme where ESD protection elements have fins that are partially silicided, and functional device fins are fully silicided. The present disclosure further provides a dual Epi scheme where ESD protection elements have fins with Epi contact, and functional devices have Fins that are fully silicided without Epi (raised S/D) contact. The present disclosure further provides a mixed silicidation and selective epitaxy (epi) FinFET process for latch-up immunity together with ESD Robustness.

Naturally, many modifications and variations of the present invention are possible in light of the above teachings. In particular, such modifications as utilizing a different substrate material or substrate structure, such as gallium arsenide or silicon on sapphire, respectively, are contemplated. Variations in the manner of fabricating structures consistent with the present invention, such as the use of ion channeling and focused ion beam implant techniques in implanting the essential well region and source and drain regions, are also contemplated. Embodiments of the present disclosure can provide substrate that possesses P-type conductivity and an essential well region possesses N-type conductivity. It is therefore to be understood that, within the scope of the appended claims, the present invention may be practiced otherwise than as specifically described.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages of the Invention

The present disclosure provides efficient ESD SCR and BJT devices.

The present disclosure provides latch-up immune and reliable functional devices.

The present disclosure provides a technological solution that achieves ESD efficient protection devices and ensures highest latch-up immunity of parasitic SCRs under the functional devices which can be across ESD protection devices in non-planar technologies.

The present disclosure provides enhanced product reliability and life expectancy.

The present disclosure provides a solution that can selectively enhance parasitic (SCR/Bipolar) action in intended parasitic/ESD devices, or can suppress the same in functional devices.

We claim:

1. A semiconductor device comprising at least one ESD protection device and at least one functional device, wherein the at least one ESD protection device comprises one or more fins partially silicided having a selective epitaxial growth before a silicidation, and wherein the at least one functional device comprises one or more fins fully silicided without an epitaxial growth.

2. A semiconductor device comprising at least one ESD protection device and at least one functional device, wherein the at least one ESD protection device comprises one or more fins having a selective epitaxial growth before a silicidation, and wherein the at least one functional device comprises one or more fins fully silicided, without an epitaxial growth.

3. The semiconductor device of claim 2, wherein said semiconductor device comprises one or more guard rings.

4. The semiconductor device of claim 2, wherein said semiconductor device comprises at least one fin made of a nanowire or an array of nanowires on top of each other.

5. The semiconductor device of claim 2, wherein said semiconductor device comprises at least one fin made of any or a combination of Si, SiGe, and Ge, materials belonging to III-V or III-Nitride groups, transition metal dichalcogenides or other 2-Dimensional semiconductors.

6. The semiconductor device of claim 2, wherein the semiconductor device comprises a 3D structure repeated in X and Y directions so as to create devices with larger electrical widths.

7. The semiconductor device of claim 2, wherein the semiconductor device comprises a substrate selected from any or a combination of a semiconductor, an insulator, and a stack of the semiconductor and the insulator.

8. An integrated circuit made of semiconductor device of claim 2.

* * * * *